United States Patent [19]

Eysermans

[11] 3,982,317
[45] Sept. 28, 1976

[54] METHOD FOR CONTINUOUS ASSEMBLY AND BATCH MOLDING OF TRANSISTOR PACKAGES

[75] Inventor: Hubert Eysermans, Manchester, N.H.

[73] Assignee: Sprague Electric Company, North Adams, Mass.

[22] Filed: July 31, 1975

[21] Appl. No.: 600,693

[52] U.S. Cl. ................................. 29/588; 29/589; 228/180 A; 357/70
[51] Int. Cl.² ........................................... B01J 17/00
[58] Field of Search ............... 29/576 S, 588, 589; 357/70; 228/180 A

[56] References Cited
UNITED STATES PATENTS

| | | | |
|---|---|---|---|
| 3,235,937 | 2/1966 | Lanzl | 29/576 S |
| 3,244,040 | 4/1966 | Schmitz | 29/589 |
| 3,413,713 | 12/1968 | Helda | 29/576 S |
| 3,439,235 | 4/1969 | Lanzl | 29/588 |
| 3,484,536 | 12/1969 | Saeschke | 357/70 |
| 3,566,458 | 3/1971 | O'Cone | 29/588 |
| 3,698,074 | 10/1972 | Helda | 29/576 S |

*Primary Examiner*—W. Tupman
*Attorney, Agent, or Firm*—Connolly and Hutz

[57] ABSTRACT

A method is described for continuously assembling transistors to a lead frame, capable of high speed production by automatic machinery. A carrier ribbon bearing transistor chips is fed to a work station to which a lead frame is also fed at about right angles thereto. The carrier ribbon end portion bearing one transistor is welded to a terminal of the lead frame and cut to separate it from the remainder of the ribbon. Lead frame strips bearing at least 10 transistors are separated from the remainder of the lead frame and placed in a multi-cavity mold for individually encapsulating the transistors.

7 Claims, 6 Drawing Figures

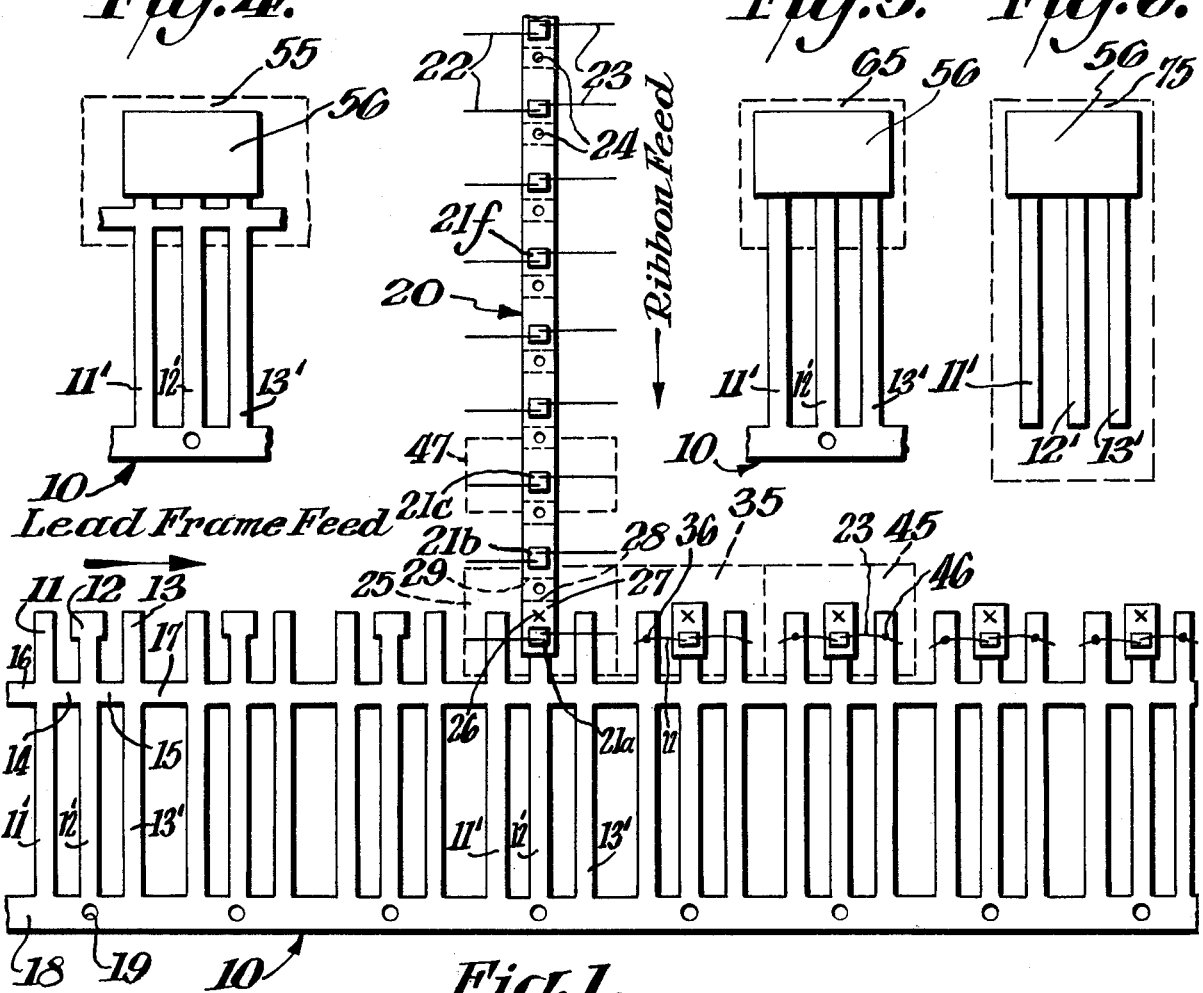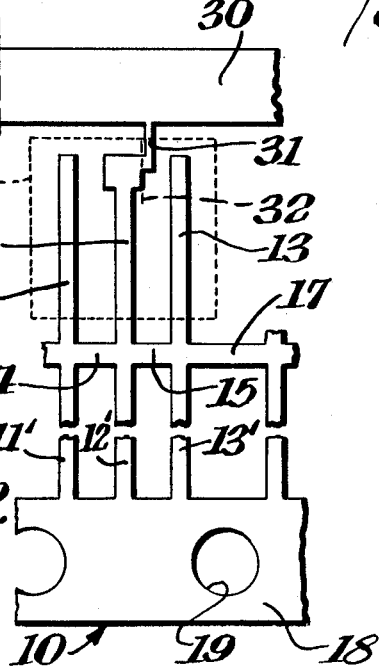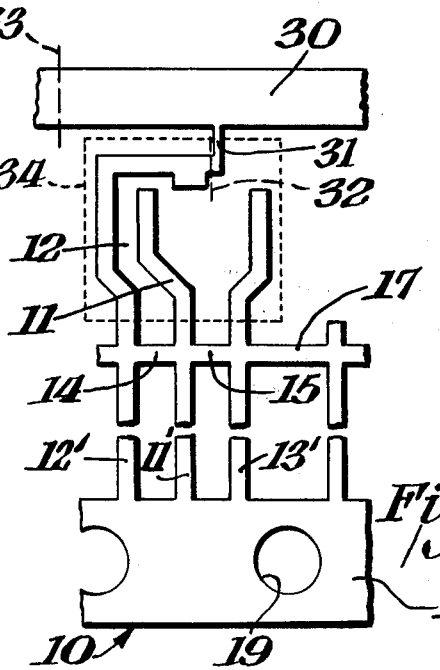

METHOD FOR CONTINUOUS ASSEMBLY AND BATCH MOLDING OF TRANSISTOR PACKAGES

BACKGROUND OF THE INVENTION

This invention relates to a method for the continuous assembly and the batch molding of transistor packages and more particularly to the use of a lead frame and a transistor bearing metal ribbon in the process.

For over a decade, transistors have been manufactured by assembling transistor chips to lead wire sets employing a chip bearing metal ribbon. The leads in each set are held relative to each other by means of a temporary header and the header held lead sets are in turn fed and guided to a work station by means of rails and other external mechanical means. A major limitation to the speed of assembly of transistors to lead sets in this system is the limited speed with which it is possible to successively feed and accurately register the separate lead sets in the work stations. Furthermore, the resin encapsulation of the individual transistor connected to a lead set is normally accomplished by casting with an epoxy resin, which is slow and requires a considerable amount of operator attention. Lead sets are not readily molded because of their lack of a disciplined geometry.

In other conventional methods for making transistor packages, a short lead frame strip is employed on which typically from 10 to 50 transistor chips are mounted. These strips of uniform geometry are then inserted into a multi-cavity mold and the transistors are individually molded in a protective resin encapsulant by a low cost standard transfer or injection molding step. It is believed that all users of lead frames for component assembly only assemble to such short lead frame strips, and that continuous assembly to long or continuous lead frames is unknown.

It is therefore an object of this invention to provide a method for the continuous assembly of transistors to a long lead frame.

It is a further object of this invention to provide a low cost method for assembly of transistor chips to a lead frame that is compatible with a subsequent low cost encapsulation step.

It is yet a further object of this invention to provide a method for the mass production of a lower cost transistor package.

SUMMARY OF THE INVENTION

A method for the continuous assembly and batch molding of transistors is described wherein initially the transistor chips are supplied on a metal carrier ribbon. A metal lead frame is provided which consists of a plurality of sets of mutually parallel metal terminals, each set preferably having three terminals each. The sets are also mutually parallel and are formed in and are a part of the lead frame. A bottom rail portion of the lead frame interconnects an end portion of each terminal and the terminal sets are uniformly spaced, the bottom rail preferably having indexing holes therein regularly spaced relative to the position of the terminal sets. An additional interconnection between the adjacent of the terminals is provided by a web portion of the lead frame intermediate the extreme ends of the terminals. The transistor chips are uniformly spaced along the carrier ribbon, two wires extend from each of the chips in opposite directions in about the plane of and away from the carrier ribbon.

In the continuous assembly of this invention a set of the lead frame terminals is fed to a predetermined position in a first work station, and an end portion of the carrier ribbon bearing one of the transistors is indexed to the first work station at about right angles to the direction of feeding the lead frame. A weld is formed between the ribbon end portion and one of the terminals of the terminal set in the first work station. Also the ribbon is cut there to separate the end portion from the remainder of the ribbon.

The welding of one of the transistor wires to an adjacent terminal is accomplished in a second work station while the other of the transistor wires is welded to the other adjacent terminal at a third work station.

After a number of transistors have been so connected to the lead frame, a strip of the lead frame bearing 10 or more transistors is separated by cutting from the remainder of the continuous lead frame. The strip is placed in a multi-cavity mold where each of the 10 or more transistors is then simultaneously molded in a protective resin. The bottom rail and connecting webs are then removed from the lead frame strip by punching so as to yield 10 or more separate transistor packages.

BRIEF DESCRIPTION OF THE DRAWING

FIG. 1 shows a portion of a long lead frame and a transistor chip bearing carrier ribbon as used in the method of this invention.

FIG. 2 shows a portion of another long lead frame of this invention containing one set of three terminals.

FIG. 3 shows a portion of yet another long lead frame of this invention containing one set of three terminals.

FIG. 4 shows a portion of a lead frame containing one terminal set, a transistor having been attached and molded at one end of the terminal set.

FIG. 5 shows the lead frame portion of FIG. 4 after the terminal connecting webs have been removed.

FIG. 6 shows the lead frame portion of FIG. 5 after the bottom rail has been removed, providing a separate transistor package of this invention.

DESCRIPTION OF THE PREFERRED EMBODIMENTS

A lead frame 10 is shown in FIG. 1 having been made from a sheet metal strip according to well known punching or etching methods. The particular lead frame shown consists of uniformly spaced sets of terminals such as the set consisting of terminals 11, 12 and 13. Webs 14 and 15 of the lead frame metal connect and hold in accurate spacing the adjacent terminals 11 and 12, and 12 and 13, respectively. Likewise, webs 16 and 17 precisely maintain the spacing between adjacent terminal sets. Terminals 11, 12 and 13 have extensions 11', 12' and 13' that as will become clear in the following description will serve as the leads of a molded package of this invention. The leads 11', 12' and 13' are connected by a bottom rail 18 of the lead frame that contains indexing holes 19 therein, each of which holes has a predetermined spacial relationship to a respective lead set. The lead frame 10 is preferably made from a sheet of copper having a thickness of about from 0.010 to 0.015 inch. After punching or etching, it is preferably plated or otherwise tin coated to provide protection against corrosion and to offer readily solderable surfaces particularly at leads 11', 12' and 13'.

Also shown in FIG. 1 is a metal carrier ribbon 20 to which there are bonded a plurality of semiconductor chips 21, which chips are uniformly spaced from each other. From each chip 21 there extend two wires 22 and 23 in opposite directions away from the ribbon but essentially in the plane of the ribbon. Reference holes or dimples 24 are formed in the ribbon 20 to aid in positional indexing of the ribbon. The semiconductor chip 21 may be a bipolar transistor to which electrical access is had to the emitter, base and collector, respectively, via the two wires and the bond between the chip body and the metal carrier ribbon. Of course, the particular lead or ribbon connection to emitter, base and collector that is made is a matter of design choice. Also other types of semiconductor chips are in general suitable for incorporation in an assembly as produced by the method of this invention.

In the preferred method steps of this invention, the lead frame 10 is fed to the right as shown in FIG. 1 so that one set of terminals 11, 12 and 13 is indexed to a predetermined position within a ribbon welding station 25. At about the same time the ribbon 20 is fed downward as shown so that the bonded transistor chip 21a which is nearest the low end of the ribbon is indexed over the terminal 12 within the ribbon welding station 25. It is desirable that there be a small separation or spacing (not shown) such as 0.010 inch between the ribbon 20 and the terminal 12 within the ribbon welding station 25 to avoid physical interference therebetween prior to forming a weld therebetween.

A weld 26 designated by an X is now made in station 25 between terminal 12 and a portion 27 of the ribbon that is adjacent this lowest transistor 21a. Next, without further advancing either the lead frame 10 or the ribbon 20, the ribbon is cut at a location indicated by the dotted line 29 so as to separate the end of ribbon portion 27 carrying transistor 21a from the remainder of ribbon 20. It is also preferred to cut along dotted line 28 later to eliminate a portion of the ribbon between transistors 21a and 21b and to trim the ribbon portion 27 and the terminals 11, 12 and 13 to a length for a better fit within the mold.

The lead frame 10 is now advanced again to the right so that ribbon portion 27 and transistor 21a are transported to a first wire welding station 35. Here a weld 36 is made between the transistor wire 22 and terminal 11. At about the same time the ribbon 20 is advanced so as to index transistor 21b in the ribbon weld station 25 wherein the ribbon weld and cutting operations are repeated.

The lead frame 10 is advanced once again so as to move transistor 21a into a second wire weld station 45 where a weld 46 is made between wire 23 and terminal 13. At the same time the wire 22 of transistor 21b is welded to a terminal 11 in wire weld station 35. At about the same time the ribbon 20 is advanced so that transistor 21c is positioned and indexed into station 25 where the ribbon 20 is welded to a terminal 12 and the corresponding ribbon portion separated from the remainder of ribbon 20.

A portion of an alternative lead frame design is shown in FIG. 2 that provides better support for the terminal 12 and thus provides an even more accurate placement of the terminal 12 in the cutting and welding stations. This is accomplished by the top rail 30 having a connecting metal web 31 to terminal 12. After a transistor-ribbon is welded to terminal 12 and the wires have been welded to terminals 11 and 13 in stations 35 and 45, respectfully, another work station (not shown) is entered in which the web 31 is separated from terminal 12 by cutting along the line indicated by dashed line 32. At the same time a portion of the top rail is separated from the remainder of top rail 30 by cutting at the dashed line 33.

Also in FIG. 2 is shown the outline of the subsequently molded portion of the transistor package, as indicated by dotted line 34.

Yet another lead frame design is shown in FIG. 3, differing from that of FIG. 2 only in that the terminal 12 to which the ribbon and transistor chip are to be attached is routed so that the lead order from left to right is 12', 11' and 13', rather than 11', 12' and 13' as in FIG. 2.

In a refinement of the above described process, a wire forming station 47 is located as shown in FIG. 1 relative to stations 25, 35, and 45. Here the wires 22 and 23 are formed if necessary so that upon reaching station 25 adequate clearance with the lead frame terminals is assured and upon subsequent indexing in wire welding stations 35 and 45, the wires are in the proper predetermined positions relative to the terminals 11 and 13 for welding thereto.

After having attached a large number of transistors to the lead frame, as described, a lead frame strip containing fifty transistors is separated from the continuous lead frame. The strip of 50 transistors may then be subjected to a temperature of 300°C for several hours to stabilize the transistors if required. It will be recognized by those skilled in the art that the stabilization step is advantageously performed after the transistor assembly to the terminals is complete. In the above-noted conventional prior art method, stabilization may not be performed after terminal assembly since the terminal lead sets are held in a header of an organic material.

The fifty transistors on a lead frame strip are then placed in a multi-cavity mold and encapsulated individually in a thermosetting resin by a standard simultaneous transfer molding step. In FIG. 4 there is shown a portion of a lead frame strip containing one molded transistor, the resin encapsulant 56 and a portion of the lead frame 10 being shown enclosed in the multi-cavity mold as indicated by dashed line 55.

The strip of fifty molded transistors is then removed from the mold and each molded transistor is positioned in a first trimming station 65 wherein the metal webs 14 and 15 are removed by punching as shown in FIG. 5. In FIG. 6 each molded transistor is placed in a final trim station 75 wherein the bottom rail of the lead frame is removed by cutting or punching.

Of course each separate strip may contain more or less than fifty transistors. For reasons of economy however, it is preferred to employ strips having at least ten transistors for simultaneous molding. It is also noted that a multi-cavity mold may accommodate two or more multi-transistor strips. For example it is practical to design a mold to contain twelve lead frame strips having fifty transistors on each strip for simultaneously molding 600 transistors.

Also the conventional injection molding of thermoplastic resins may be employed here. However, it is preferred to employ thermosetting encapsulating materials for transistor chips which generally constitutes a more gentle process less likely to damage the wires and the transistor chip.

In a completely automated execution of the assembly steps of this invention the lead frame 10 is typically 300 feet long and includes 20,000 terminal sets, being supplied from a reel as it is fed to the operating work stations. Similarly the transistor chip bearing carrier ribbon 20 is fed from a supply reel. In a prototype machine of this type, an assembly rate of eight to nine thousand transistors per hour was achieved which is from 35 to 50% faster than a conventional machine that assembles transistor chips to lead sets. Furthermore, the lead frame strips of fifty transistors that are produced thereby are capable of being molded and separated into individual transistor packages requiring less than half the number of operators that are required for the conventional steps of casting fifty individual transistor-lead wire sets. From limited laboratory data it is believed that the yield and quality of transistors manufactured by the combination method of this invention will be significantly higher than by the above-noted conventional method. Thus in addition to a substantially reduced cost, transistors manufactured according to the principles of this invention offer a highly disciplined geometry and high quality.

What is claimed is:

1. A method for the continuous assembly and batch molding of transistor packages comprising:
   a. feeding a set of essentially mutually parallel metal terminals to a predetermined position in a first work station, a plurality of said sets being formed in and being a part of a continuous lead frame, said sets being uniformly spaced, mutually parallel and interconnected by a bottom rail portion of said lead frame, an additional interconnection between the adjacent of said terminals being effected by a web portion of said lead frame intermediate the extreme ends of said terminals;
   b. indexing an end portion of a continuous metal carrier ribbon to said first work station at about right angles to the direction of said feeding of said terminals thereto, said carrier ribbon having attached thereto a plurality of uniformly spaced transistor chips, two wires extending from each of said chips in opposite directions in about the plane of and away from said carrier ribbon, said carrier end portion bearing one of said transistors;
   c. forming a weld between one of said terminals at said first work station and said carrier ribbon end portion;
   d. cutting said carrier ribbon and separating said end portion therefrom;
   e. welding one of said wires of said one transistor to an adjacent of said terminals in a second work station;
   f. welding the other of said wires of said one transistor to the other adjacent terminal in a third work station;
   g. separating from said continuous lead frame a strip portion thereof bearing ten or more of said transistors;
   h. simultaneously molding in a multi-cavity mold each of said transistors of said strip in a protective resin; and
   i. removing said bottom rail and said interconnecting webs.

2. The method of claim 1 wherein said lead frame additionally includes a top metal rail that is connected by a metal span to each of said terminals that is to have a carrier end portion welded thereto, said method additionally comprising severing said metal span prior to said molding.

3. The method of claim 1 wherein said one of said terminals having a predetermined position in said first work station has an overlapping relationship with but is spaced from said indexed end portion of said carrier ribbon.

4. The method of claim 1 wherein said lead frame metal is selected from copper and an alloy thereof.

5. The method of claim 4 wherein said lead frame is tin plated.

6. The method of claim 1 wherein said protective resin is a thermosetting resin and said molding is accomplished by a standard transfer molding step.

7. The method of claim 1 additionally comprising, after said separating said strip from said lead frame, stabilizing said transistors on said strip by subjecting said strip to about 300°C for several hours.

* * * * *